(12) United States Patent
Hampp et al.

(10) Patent No.: US 7,615,840 B2
(45) Date of Patent: Nov. 10, 2009

(54) DEVICE PERFORMANCE IMPROVEMENT USING FLOWFILL AS MATERIAL FOR ISOLATION STRUCTURES

(75) Inventors: Roland Hampp, Poughkeepsie, NY (US); Alois Gutmann, Poughkeepsie, NY (US); Jin-Ping Han, Fishkill, NY (US); O Sung Kwon, Wappingers Falls, NY (US)

(73) Assignee: Infineon Technologies AG, Neubiberg (DE)

( * ) Notice: Subject to any disclaimer, the term of this patent is extended or adjusted under 35 U.S.C. 154(b) by 33 days.

(21) Appl. No.: 11/766,234

(22) Filed: Jun. 21, 2007

(65) Prior Publication Data

US 2008/0315267 A1      Dec. 25, 2008

(51) Int. Cl.
*H01L 29/06* (2006.01)

(52) U.S. Cl. .............. 257/506; 257/374; 257/E29.018
(58) Field of Classification Search ............... 257/506, 257/374, E29.018
See application file for complete search history.

(56) References Cited

U.S. PATENT DOCUMENTS

| 7,470,973 | B2 * | 12/2008 | Takao .................... 257/627 |
| 2007/0096223 | A1 * | 5/2007 | Chidambarrao et al. ..... 257/396 |
| 2007/0132054 | A1 * | 6/2007 | Arghavani et al. .......... 257/506 |
| 2007/0181966 | A1 * | 8/2007 | Watatani et al. ............ 257/506 |
| 2007/0228488 | A1 * | 10/2007 | Kishii et al. ................. 257/374 |
| 2008/0150037 | A1 * | 6/2008 | Teo et al. .................... 257/374 |

\* cited by examiner

*Primary Examiner*—Victor A Mandala
(74) *Attorney, Agent, or Firm*—Slater & Matsil, L.L.P.

(57) ABSTRACT

A trench is formed in the surface of a provided semiconductor body. An oxide is deposited in the trench and a cap is deposited on the oxide, wherein the combination of the cap and the oxide impart a mechanical stress on the semiconductor body.

11 Claims, 5 Drawing Sheets

DEVICE PERFORMANCE IMPROVEMENT USING FLOWFILL AS MATERIAL FOR ISOLATION STRUCTURES

TECHNICAL FIELD

This invention relates generally to semiconductor devices and methods, and more particularly to a strained semiconductor device and a method of making the same.

BACKGROUND

Semiconductor devices are used in a large number of electronic devices, such as computers, cell phones and others. One of the goals of the semiconductor industry is to continue shrinking the size and increasing the speed of individual devices. Smaller devices can operate at higher speeds since the physical distance between components is smaller. In addition, higher conductivity materials, such as copper, are replacing lower conductivity materials, such as aluminum. One other challenge is to increase the mobility of semiconductor charge carriers such as electrons and holes.

One technique to improve transistor performance is to strain (i.e., distort) the semiconductor crystal lattice near the charge-carrier channel region. Transistors built on strained silicon, for example, have greater charge-carrier mobility than those fabricated using conventional substrates. One technique to strain silicon is to provide a layer of germanium or silicon germanium. A thin layer of silicon may be grown over the germanium-containing layer. Since the germanium crystal lattice is larger than silicon, the germanium-containing layer creates a lattice mismatch stress in adjacent layers. Strained channel transistors may then be formed in the strained silicon layer.

Another technique is to provide a stress layer over the transistor. Variants of stress layers can be used for mobility improvement and performance boost of devices. For example, stress can be provided by a contact etch stop layer (CESL), dual layers, and stress memory transfer layers. Most of these techniques use nitride layers to provide tensile and compressive stresses; however, other materials can be used in other applications, e.g., HDP oxide layers.

Another method for inducing strain involves inducing stress in the STI regions adjacent to the transistor. For example, using an HDP oxide fill within the STI regions would provide compressive stress. Other materials, such as porous oxide, could also be used to impart stress in a device; however, some of these porous materials are not well suited to withstand the rigors and conditions of semiconductor processing.

In the field of small, densely packed applications using small geometry CMOS transistors, however, the use of STI regions to enhance carrier mobility becomes challenging because, as the geometries of the semiconductor process get smaller, higher stress is required within the STI regions in order to maintain adequate performance. What is needed are improved and manufacturable methods and materials to maximize the amount of channel stress.

SUMMARY OF THE INVENTION

In one embodiment, a method of forming a stress inducing shallow trench isolation is disclosed. A trench is formed in the surface of a provided semiconductor body. An oxide is deposited in the trench and a cap is deposited on the oxide, wherein the combination of the cap and the oxide impart a mechanical stress on the semiconductor body.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention and do not limit the scope of the invention.

The invention will now be described with respect to preferred embodiments in a specific context, namely a method for improving carrier mobility in a CMOS device. Concepts of the invention can also be applied, however, to other electronic devices. As one example, bipolar transistors (or BiCMOS) can utilize concepts of the present invention.

Figure 1:
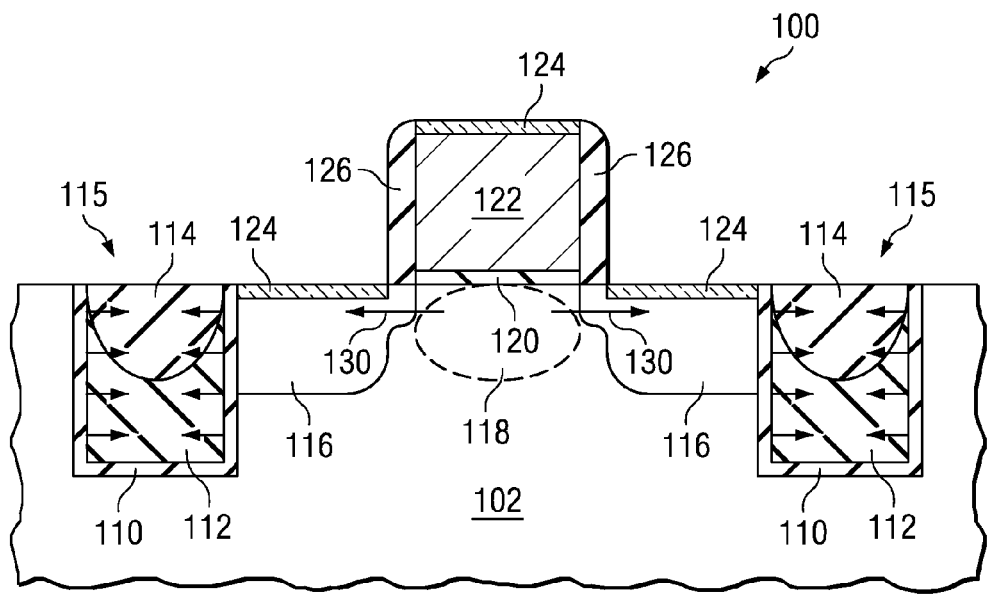
FIG. 1 contains a cross-sectional view of a preferred embodiment.

With reference now to FIG. 1, a cross-sectional view of a semiconductor device 100 is shown. In a preferred embodiment of the present invention STI regions 115, including a liner 110, a layer of porous oxide 112, and a cap layer of another less porous oxide 114, are fabricated on semiconductor body 102. Each of the oxide layers 112 and 114 can be thermally cycled to provide stress 130 on channel region 118. A MOS device including a gate dielectric 120, a gate electrode 122, spacers 126, and source/drain regions 116, is formed over semiconductor body 102 between STI regions 115. Silicide 124 is formed over the source/drain regions 116 and gate electrode 122 in order to provide a low resistance contact region.

FIGS. 2a-2i provide cross-sectional views that illustrate a preferred embodiment for forming a semiconductor device 100 of the present invention. While certain details may be explained with respect to only one of the embodiments, it is understood that these details can also apply to other ones of the embodiments.

Figure 2A:
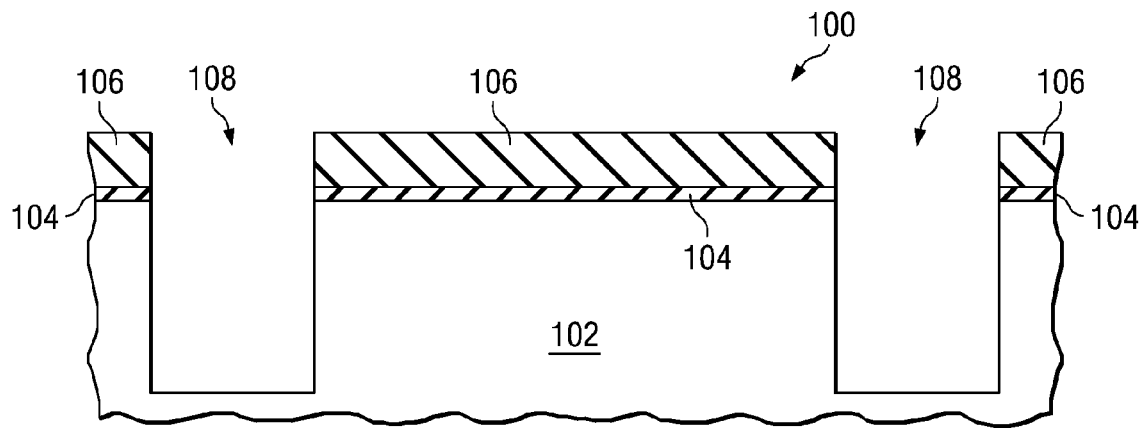
FIGS. 2a-2i provide cross-sectional views of a preferred embodiment process.

Referring first to FIG. 2a, a semiconductor body 102 is provided. In the preferred embodiment, the semiconductor body 102 is a silicon wafer. For example, semiconductor body 102 can be a bulk monocrystalline silicon substrate (or a layer grown thereon or otherwise formed therein) or a layer of a silicon-on-insulator (SOI) wafer. In other embodiments, other semiconductors such as silicon germanium, germanium, gallium arsenide or others can be used with the wafer. With these other materials, the shown source/drain regions 116 (see FIG. 2h) would be comprised of other materials.

In a preferred embodiment of the present invention, isolation trenches 108 for the stress inducing STI regions 115 (see FIG. 1) can be formed using conventional techniques. In a preferred embodiment of the present invention, a CMP stop layer 106 is formed over semiconductor body 102. The CMP stop layer 106 is typically made from silicon nitride, although other materials, such as titanium nitride can also be used. The silicon nitride film is deposited via a LPCVD process at a temperature of between 650° C. and 850° C., a pressure of between about 200 mTorr and 300 mTorr, and gas flow rates of between about 100 sccm and 500 sccm for $NH_3$, and between about 50 sccm and 200 sccm for Dichlorsilane ($SiH_2Cl_2$) (DCS). A typical mixture ratio between $NH_3$ and DCS is 5:1. In a preferred embodiment of the present invention, a deposition time of approximately 45 min is used. A trilayer softmask (not shown) is formed over the CMP stop layer. This trilayer stack includes resist, silicon anti-reflective coating (ARC) and an optically dense layer (ODL). A softmask is preferable for fine geometry processes such as a 45 nm process, because other forms of lithography would have difficulty exposing and printing the critical dimensions required for 45 nm. The softmask is patterned to expose isolation areas 108 according to conventional techniques. In alternative embodiments of the present invention, other exposure techniques, such as using a hard mask, for example, can be used.

In a preferred embodiment of the present invention, a pad-oxide layer 104 is formed on semiconductor body 102 before the CMP stop layer 106 in order to provide a stress compensation layer between the silicon surface and the silicon nitride of the CMP stop layer 106. Later on in the process flow during the implant process steps the pad-oxide layer 104 is used as a scattering layer for the implanted ions. The Pad oxide layer 104 typically includes $SiO_2$ and is deposited by a LPCVD furnace process at a temperature of between about 650° C. and 900° C. at a pressure of about 760 Torr. Also present in the furnace is $O_2$ at a gas flow rate between about 8 Liter and 10 Liter, and Dichloroethene $C_2H_2Cl_2$ (DCE) at a gas flow rate of between about 50 sccm and 100 sccm, and a deposition time of approximately 30 min. The DCE is used as a cleaning solvent, and a typical ratio of mixture is 1% of DCE per volume of other gasses present.

The exposed portions of semiconductor body 102 can then be etched to the appropriate depth using a reactive ion etch using halogen/oxygen based etch chemistries ($CH_2F_2/O_2/CF_4$ or $CHF_3/CF_4$ and $HBr/O_2$), thereby exposing trenches 108. In a preferred embodiment of the present invention, the trenches are typically etched to a depth of between about 200 nm and 400 nm. In other embodiments, trenches 108 may be etched to different depths depending on which process is used.

Figure 2B:
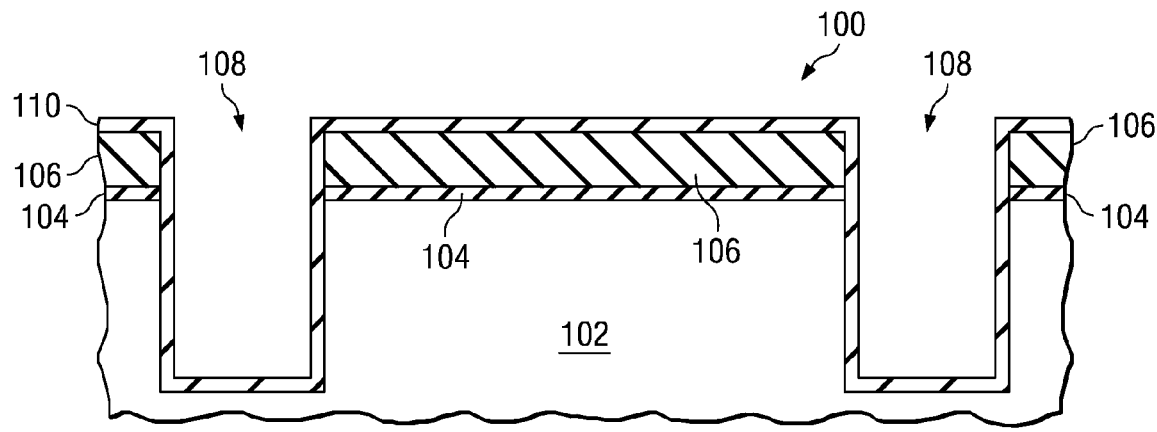

Turning to FIG. 2b, a liner is deposited. In a preferred embodiment of the present invention, a SiON liner 110 is deposited. The liner can be created from a Rapid Thermal Oxidation (RTO) process at a temperature of between about 750° C. and 1000° C. followed by a $NH_3$ bake at temperature of about 1050° C. Alternatively, a Rapid Thermal Processing (RTP) nitride deposition using $NH_3$ performed at a temperature of between about 650° C. and 1000° C., followed by a $RTN_2O$ re-oxidation (an RTO with $N_2O$) at a temperature of between about 900° C. and 1150° C. can be performed. In yet another alternative embodiment of the present invention, an yet another alternative embodiment would be to perform an In-Situ Steam Generated (ISSG) oxide can be performed at a temperature of between about 700° C. and 900° C. ISSG is a low-pressure process (typically below 20 torr) wherein premixed $H_2$ and $O_2$ are introduced to the process chamber directly, without pre-combustion. The purpose of liner 110 is to prevent boron diffusion from the active area into the $SiO_2$ from the STI fill and also to relax the surface conditions at the trench sidewalls which were degraded during the RIE process. In other embodiments, other materials such as $SiO_2$ or $SiO_2+SiN$, may be used, or liner 110 may be omitted.

Figure 2C:
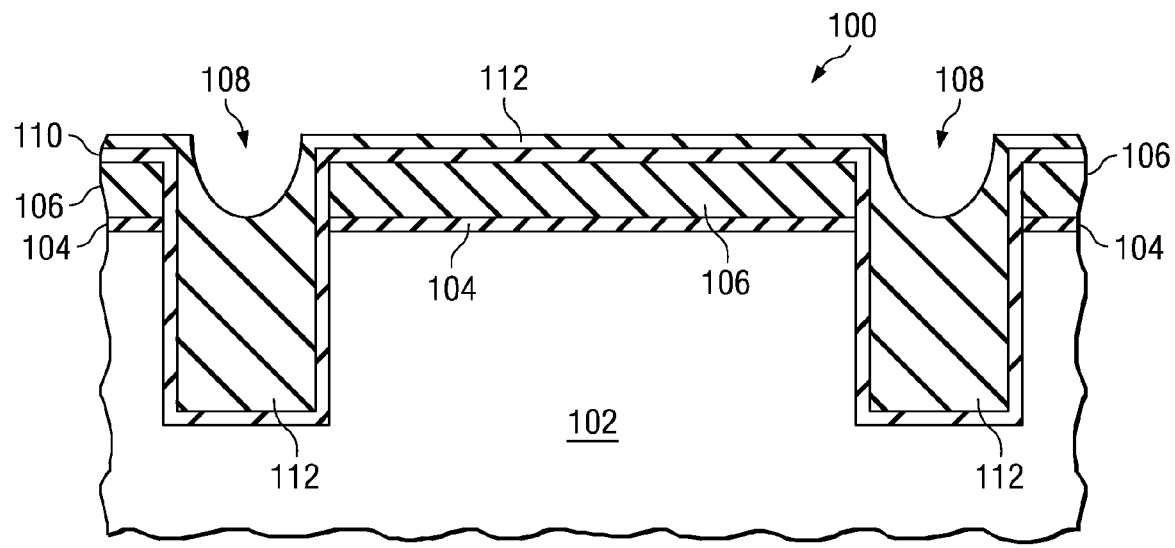

Turning to FIG. 2c, a layer of oxide 112 is deposited. In a preferred embodiment of the present invention, a flowable oxide such as Flowfill™ made by AVIZA is deposited. Typically, silane or dimethylsilane $(CH_3)_2SiH_2$ is introduced into the deposition chamber while the semiconductor wafers rests on a chuck cooled to between about 0° C. and 8° C. $H_2O_2$ is introduced in the chamber, and the resulting reaction creates a monosilicic acid which condenses on the cooled surface of semiconductor body 102 filling the inside of trenches 108. The gel-like behavior of the Flowfill material permits an excellent gapfill capability while providing the benefit of self-planarization of the deposited oxide film simultaneously. Therefore trenches with extremely high aspect ratios (>10:1) and any potential sidewall shape can be filled without creating a void within. However, during the condensation reaction water ($H_2O$) and silanol ($SiH_3$—OH) develop as by-products. The —OH groups originating from these by-products are incorporated as moisture into the film and create a larger Si—O—Si bonding length. Therefore the film properties in regards of density can be described as porous.

After the deposition of oxide layer 112, the oxide is annealed. Annealing the oxide removes the moisture and causes shrinkage in the oxide which is confined in the trench. In a preferred embodiment of the present invention, oxide layer 112 shrinks about 10% as a result of the annealing step. This shrinkage causes tensile stress on the walls of trenches 108 which is mechanically transferred to the regions of semiconductor body 102 surrounding trenches 108.

The annealing of the layer of oxide can be achieved thermally by ultra-violet (UV) light or by plasma. The most effective method of annealing that creates the most stress on the walls of trenches 108 is a combination of thermal and UV annealing. In a preferred embodiment of the present invention, oxide layer 112 is first heated to a temperature of between about 300° C. and 450° C., then exposed to UV light for 10-30 min. In a preferred embodiment, both process steps can be conducted in an annealing chamber equipped with a heating chuck that provides thermal heating. In a preferred embodiment, two UV lamps are mounted on the inside of the chamber lid which provide UV radiation. In this preferred embodiment of the present invention, the UV lamp power is between about 50 mWatts/$cm^2$ and 800 mWatts/$cm^2$ with a wavelength of between about 150 nm and 300 nm. If less stress is needed, a thermal, UV, or plasma anneal or a combination thereof may be used.

While the 10% shrinkage achievable with the annealed flowable oxide is effective at generating stress, using the flowable oxide to completely fill trench 108 poses difficulties.

Because of the porosity of the flowable oxide, the oxide etches very quickly during a wet etch. Consequently, wide and narrow trenches would be filled unevenly. Narrow trenches would have most or all of the oxide etched away while wider trenches would still have some material in them. This potential problem with "etch attack" is addressed by placing a cap (not shown) on the top of oxide layer 112.

Figure 2D:
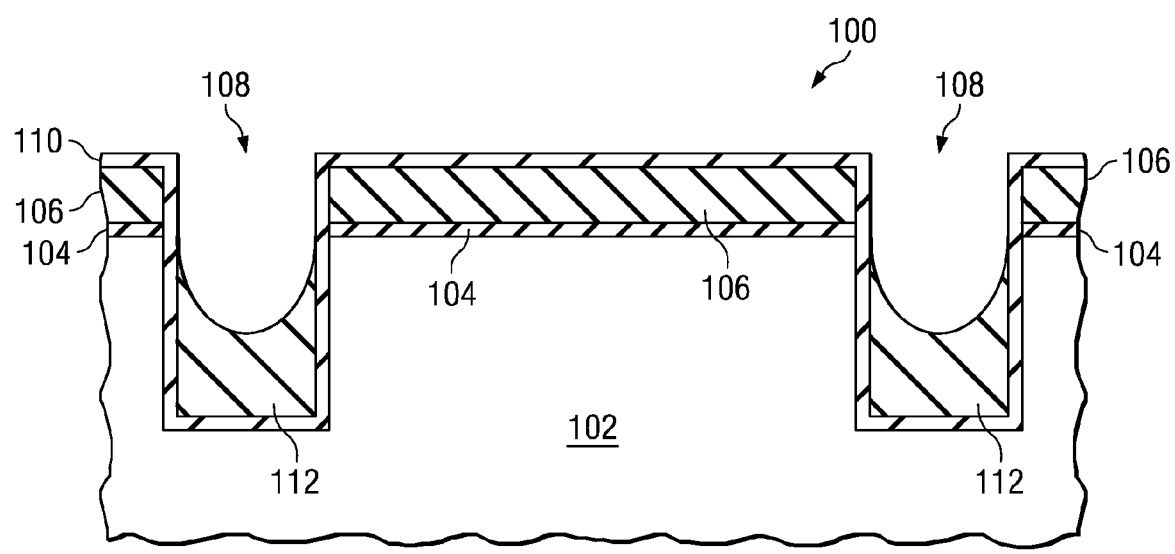

Turning to FIG. 2d, the oxide layer 112 is recessed with a highly anisotropic etch, e.g. a $NF_3$/Ar gas mixture. In a preferred embodiment the Flowfill oxide is removed from the upper trench sidewalls in order to avoid the formation of a 'divot' or groove on the wafer surface at the edge of the STI. The etch chemistries used later on in the process flow would etch any flowable oxide exposed much faster compared to the thermal oxide from the pad oxide or the TEOS oxide from the cap and create a divot. A divot is problematic for device performance, because the presence of a divot creates a "corner" device with difficult to model electrical performance and behavior.

Figure 2E:
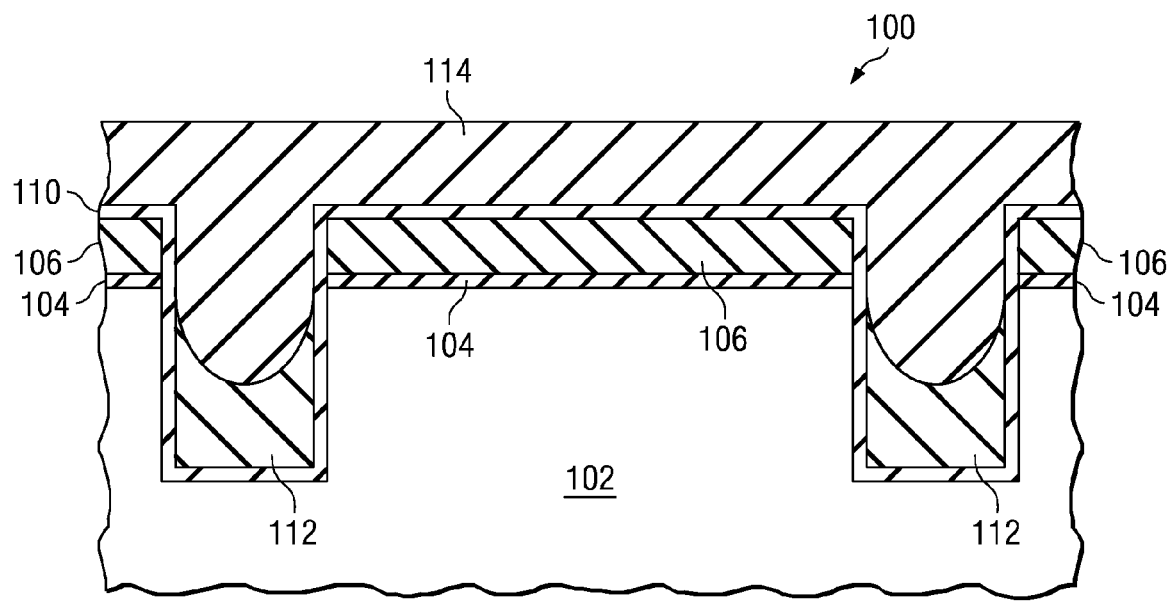

As shown in FIG. 2e, a cap layer 114 is deposited over the surface of the wafer so that trenches 108 (FIG. 2d) are completely filled. In a preferred embodiment of the present invention, a TEOS—Ozone SACVD process (HARP™) made by Applied Materials is used. Like the flowable oxide material, HARP is also a porous material that shrinks after it is heated. Such a shrinkage also creates a tensile stress in the silicon surrounding STI regions 115 (FIG. 1), but the HARP shrinkage is only about 5% compared to the 10% shrinkage achievable by the flowable oxide. By combining the flowable oxide and the HARP material, a greater stress can be imparted to the silicon surrounding STI regions 115 (FIG. 1) than if the HARP material were used alone, while being more practically manufacturable than having the trenches filled only with the flowable oxide. In alternative embodiments of the present invention, other materials can be used instead of HARP. For example, HDP, which creates compressive stress rather than tensile stress, can also be used for cap layer 114.

In a preferred embodiment of the present invention, deposition of the HARP film proceeds according to conventional techniques. A TEOS precursor is vaporized and introduced in the deposition chamber. The conversion from TEOS to silicon dioxide is essentially a separation and significant restructuring of the incorporated atoms. Silanol and methyl groups will be crated at the hot wafer surface. Neighboring silanol molecules form Si—O—Si bridges and create the silicon-oxide scaffolding. However, TEOS will not adsorb onto an alkyl-covered surface. Consequently the deposition rate is limited by the ability to remove the surface methyl groups. A low pressure or a low ozone flow or a lower temperature will affect the process positively in regards of deposition rate but definitely will furnish a porous film which attracts moisture form ambient air. In alternative embodiments where HARP is not used, the deposition process proceeds according to the conventional process required for the material used.

After the deposition of cap layer 114, the HARP material is annealed either with a dry or a wet anneal process to between 600° C. and 1050° C. for between about 15 minutes and 45 minutes in order to reduce the moisture content of the film. The heating process also facilitates shrinkage of the cap layer 114 which creates a tensile stress in silicon surrounding STI regions 115 (FIG. 1). After the cap layer 114 undergoes the thermal process, a chemical mechanical polish (CMP) is performed to remove portions of the cap layer 114 not within trenches 108, CMP stop layer 106, pad oxide 104, and excess portions of liner 110 not within trenches 108.

Figure 2F:
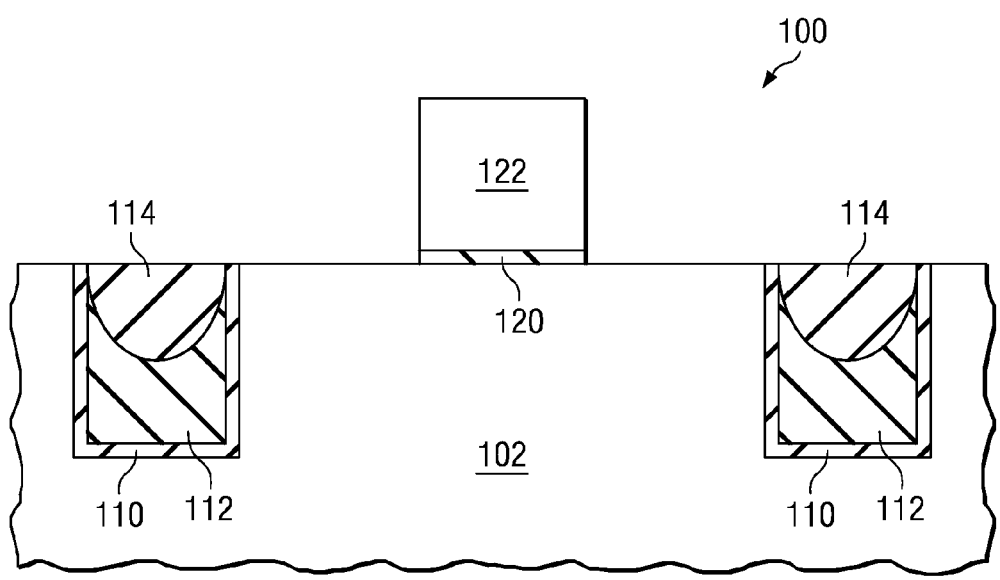

Turning to FIG. 2f, device 100 is shown after the CMP and after a gate stack is formed. A gate dielectric 120 is deposited over exposed portions of semiconductor body 102. In one embodiment, the dielectric 120 comprises an oxide (e.g., $SiO_2$), a nitride (e.g., $Si_3N_4$), or a combination of oxide and nitride (e.g., SiON, or an oxide-nitride-oxide sequence). In other embodiments, a high-k dielectric material having a dielectric constant of about 5.0 or greater is used as gate dielectric 120. Suitable high-k materials include $HfO_2$, $HfSiO_x$, $Al_2O_3$, $ZrO_2$, $ZrSiO_x$, $Ta_2O_5$, $La_2O_3$, nitrides thereof, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, combinations thereof, or combinations thereof with $SiO_2$, as examples. Alternatively, gate dielectric 120 can comprise other high-k insulating materials or other dielectric materials. As implied above, gate dielectric 120 may comprise a single layer of material, or alternatively, gate dielectric 120 may comprise two or more layers.

Gate dielectric 120 may be deposited by chemical vapor deposition (CVD), atomic layer deposition (ALD), metal organic chemical vapor deposition (MOCVD), physical vapor deposition (PVD), or jet vapor deposition (JVD), as examples. In other embodiments, gate dielectric 120 may be deposited using other suitable deposition techniques. Gate dielectric 120 preferably comprises a thickness of about 10 Å to about 60 Å in one embodiment, although alternatively, gate dielectric 120 may comprise other dimensions.

In the illustrated embodiment, the same dielectric layer would be used to form the gate dielectric 120 for both the p-channel and n-channel transistors. This feature is not required, however. In alternate embodiments, the p-channel transistor and the n-channel transistor could each have different gate dielectrics.

Gate electrode 122 is formed over gate dielectric 120. Gate electrode 122 preferably comprises a semiconductor material, such as polysilicon or amorphous silicon, although, alternatively, other semiconductor materials may be used for gate electrode 122. In other embodiments, gate electrode 122 may comprise TiN, HfN, TaN, W, Al, Ru, RuTa, TaSiN, $NiSi_x$, $CoSi_x$, $TiSi_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, a partially silicided gate material, a fully silicided gate material (FUSI), other metals, and/or combinations thereof, as examples. In one embodiment, gate electrode 122 comprises a doped polysilicon layer underlying a silicide layer (e.g., titanium silicide, nickel silicide, tantalum silicide, cobalt silicide, or platinum silicide).

The gate layer (and optionally the gate dielectric layer) are patterned and etched using known photolithography techniques to create gate electrode 122 of the proper pattern. In a preferred embodiment of the present invention, the gate layer will be etched to achieve a gate length of less than 60 nm, for example, 45 nm. After formation of gate electrode 122, lightly doped source/drain regions (not shown) can be implanted using gate electrode 122 as a mask. Other implants (e.g., pocket implants, halo implants or double-diffused regions) can also be performed as desired.

Figure 2G:
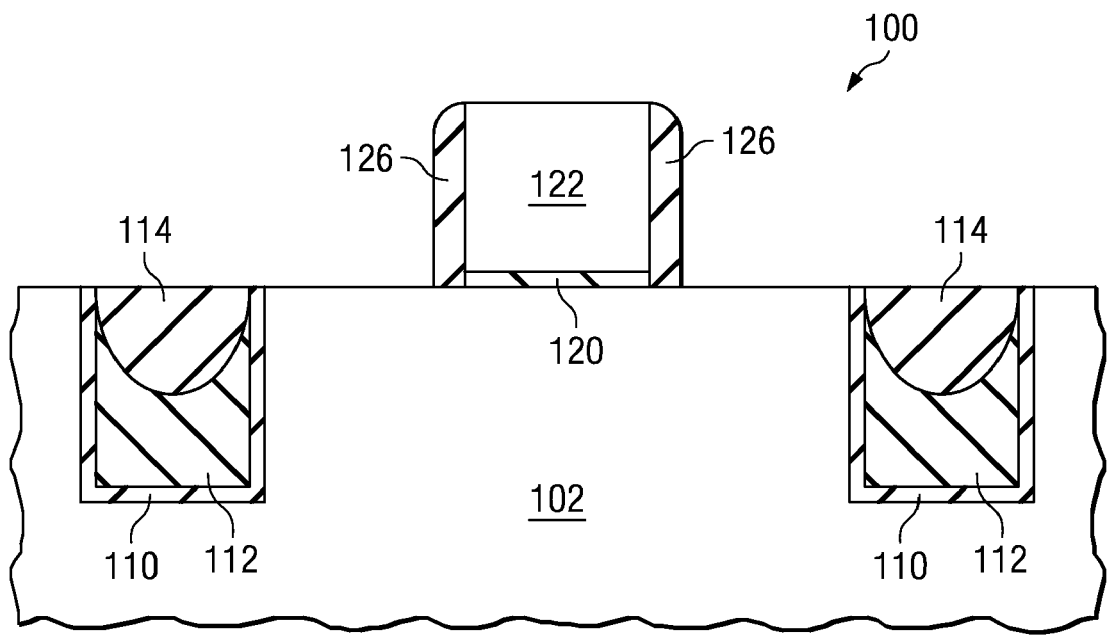

As shown in FIG. 2g, spacers 126, which are formed from an insulating material such as an oxide and/or a nitride, can be formed on the sidewalls of gate dielectric 120 and electrode 122. In the illustrated embodiment, spacers 126 are formed by the deposition of a conformal layer followed by an anisotropic etch. In a preferred embodiment, spacers 126 are formed from an oxide (e.g., a low temperature oxide).

Figure 2H:
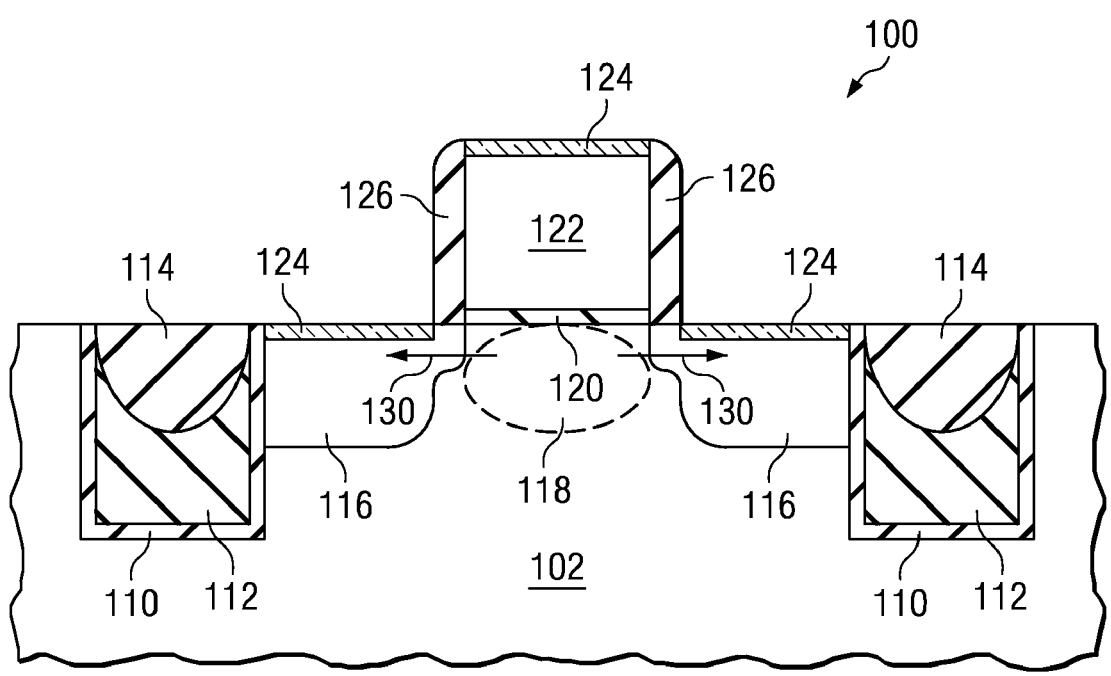

Turning to FIG. 2h, source/drain regions are formed. The upper surface of device 100 is exposed to a p-type ion implant forming heavily doped source/drain regions 116. If device 100 is a p-channel device, for example, boron ions can be implanted with a dose of about $5\times10^{14}$ cm$^{-2}$ to about $5\times10^{15}$ cm$^{-2}$ and implant energy between about 1 keV and about 5 keV. In other embodiments, other materials, such as BF$_2$, can be implanted. If, on the other hand, device 100 is an n-channel device, an n-type ion implant is used to form heavily doped source/drain regions 116 of the n-channel transistor. In the preferred embodiment, arsenic or phosphorus ions are implanted into source/drain regions 116. For example, arsenic ions can be implanted with a dose of about $1\times10^{15}$ cm$^{-2}$ to about 5×1015 cm$^{-2}$ and an implant energy between about 10 keV and about 50 keV. In other embodiments, other materials, such as phosphorous, can be implanted.

Silicide regions 124 can then be formed over source/drain regions 116, and gate electrode 122 to form low resistivity upper surface regions. Silicide is formed by first depositing a silicidation metal over source/drain regions 116 and over gate electrode 122, then subjecting the structure to an annealing process. In the preferred embodiment, the silicidation metal is nickel, but the metal could also be cobalt, copper, molybdenum, titanium, tantalum, tungsten, erbium, zirconium, platinum, or combinations thereof. In one example, semiconductor body 102 is heated to about 600° C. or 700° C. to form a single layer of nickel silicide.

Figure 2I:
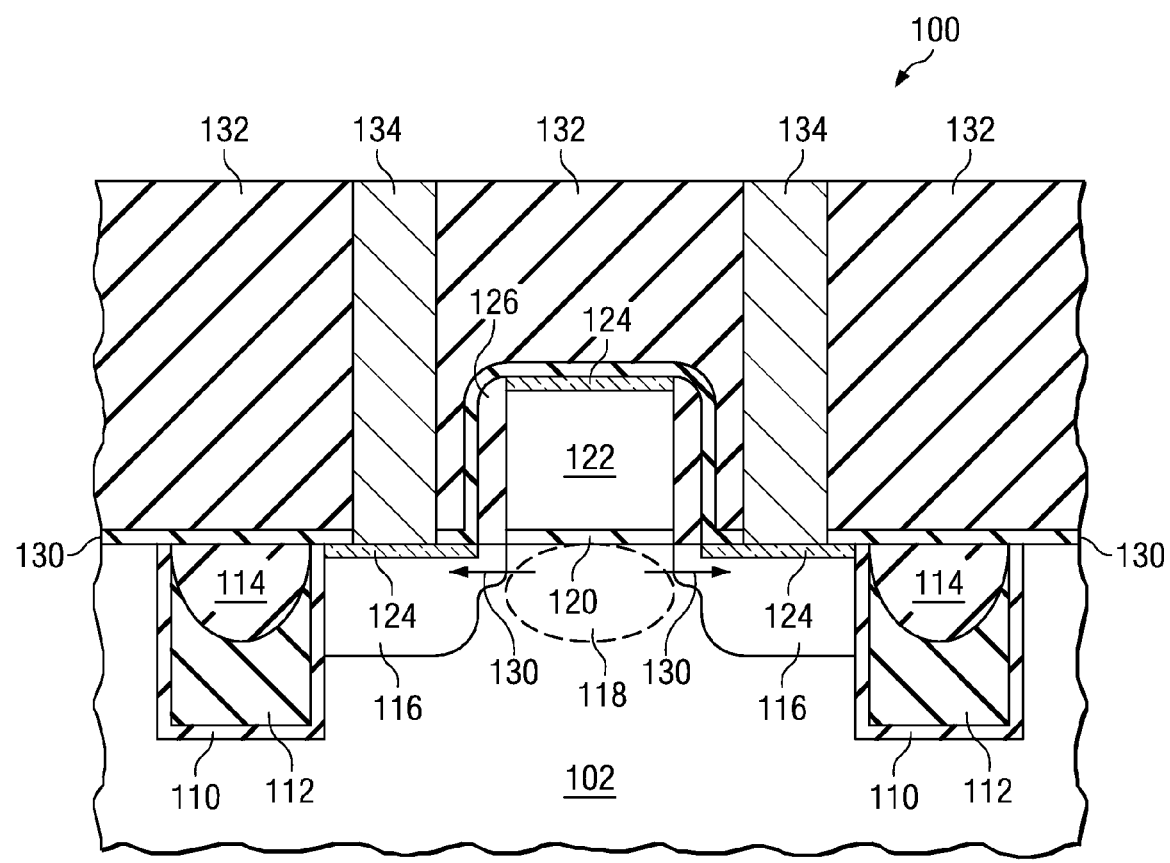

Referring now to FIG. 2i, a contact etch stop layer (CESL) 130 is formed over the surface of the device 100. In a preferred embodiment of the present invention, a nitride film (e.g., silicon nitride) is deposited, but other materials can be deposited. A pre-metal dielectric (PMD) layer 132 is then formed over the CESL 130. Suitable PMD layers include materials such as doped glass (BPSG, PSG, BSG), organo silicate glass (OSG), fluorinated silicate glass (FSG), spun-on-glass (SOG), silicon nitride, and PE plasma enhanced tetraethyloxysilanei (TEOS), as examples.

In regions where contact holes are made, PMD layer 132 is etched down to CESL 130. Using a contact mask, photoresist (not shown) is deposited to mask off the non-exposed regions to the etch process. PMD layer 132 is then etched down to CESL 130 using standard etch techniques. In this step, PMD layer 132 etches away at a faster rate than CESL 130. Once the etch is complete, the photoresist may be removed. A second etch is then performed. This time, CESL 130 is etched to expose silicided source/drain regions 116 using PMD layer 132 as a mask using standard etch techniques.

Source/drain contacts 134 are formed through PMD layer 132 by depositing conductive material on the exposed portions of silicided source/drain regions 116. Any standard contact fabrication technique may be used. Typically, a liner/barrier stack, such as titanium followed by TiN, is deposited to form an ohmic contact, after which tungsten is deposited using CVD techniques. Metallization layers that interconnect the various components are also included in the chip, but are not illustrated for the purpose of simplicity.

One advantage of the embodiments of the present invention described herein above is that by filling an STI trench with a flowable oxide and placing a HARP cap on the flowable oxide, a greater net stress 130 can be imparted to channel region 118 and active silicon of the device region by the STI trench than could be imparted by filling the STI trench entirely with the HARP material. Furthermore, the disclosed embodiments of the present invention avoid the problem of a direct etch attack on the flowable oxide. The problem of a direct etch attack can manifest itself as an inability to simultaneously create both wide and narrow trenches.

Figure 3:
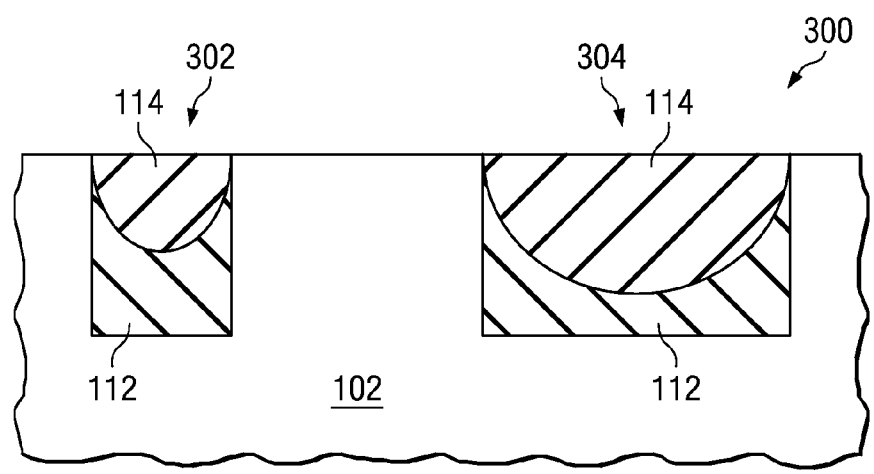
FIG. 3 contains a cross-sectional view of an alternative embodiment.

Turning to FIG. 3, a cross-section of two STI regions fabricated according to an embodiment of the present invention is shown. STI region 302 depicts a narrow trench and STI region 304 depicts a wide trench. While the oxide layer regions 112 are at different depths because of the manner by which the NF$_3$ etches oxide layer 112, the etch rate is slow enough to control the etch depth. Oxide layer regions 112 are etched to different depths because of trench-size dependent differences in fill and recess behavior. If flowable oxide were used to completely fill STI regions 302 and 304, the oxide in narrow trenches would be obliterated.

The scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a semiconductor body;
   a trench disposed in the surface of the semiconductor body;
   a flowable oxide layer under a first level of tensile stress disposed in a lower portion of the trench; and
   a cap disposed in the trench above the oxide layer, said cap under less tensile stress than said first level, and wherein the combination of the oxide layer and the cap provides a mechanical force on sidewalls of the trench.

2. The device of claim 1, wherein the cap comprises HARP™.

3. The device of claim 1, further comprising a liner disposed between a bottom and the sidewalls of the trench and the oxide layer.

4. The device of claim 3, further comprising an electronic component disposed adjacent to the trench.

5. The device of claim 4, wherein the electronic component is a MOS transistor.

6. The device of claim 5, wherein the MOS transistor comprises a gate and source/drain regions.

7. The device of claim 6, wherein the source/drain regions are n-type and wherein the MOS transistor comprises an NMOS device.

8. The device of claim 1, wherein the cap comprises an HDP deposited oxide.

9. The device of claim 1, wherein said flowable oxide layer is an annealed flowable oxide layer.

10. The device of claim 9, wherein said cap is annealed.

11. The device of claim 1, wherein said cap is annealed.

* * * * *